(12) United States Patent
Fujita (10) Patent No.: US 6,759,878 B2
(45) Date of Patent: Jul. 6, 2004

(54) VOLTAGE COMPARATOR CIRCUIT AND SUBSTRATE BIAS ADJUSTING CIRCUIT USING SAME

(75) Inventor: Tetsuya Fujita, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 494 days.

(21) Appl. No.: 09/769,306

(22) Filed: Jan. 26, 2001

(65) Prior Publication Data

US 2003/0020516 A1 Jan. 30, 2003

(30) Foreign Application Priority Data

Jan. 28, 2000 (JP) ........................................ 2000-020810

(51) Int. Cl.[7] ................................................ H03K 5/22
(52) U.S. Cl. ........................................................ 327/66
(58) Field of Search ................................. 327/530, 534, 327/535, 537, 538, 540, 541, 543, 546, 63–66, 70

(56) References Cited

U.S. PATENT DOCUMENTS

| | | | | |
|---|---|---|---|---|
| 5,483,196 A | | 1/1996 | Ramet ........................ 330/257 |
| 5,668,487 A | * | 9/1997 | Chonan ....................... 327/80 |
| 5,818,213 A | * | 10/1998 | Kim ............................ 323/315 |
| 5,854,561 A | * | 12/1998 | Arimoto et al. ............ 327/534 |
| 5,966,044 A | * | 10/1999 | Naka ........................... 327/535 |
| 6,104,233 A | * | 8/2000 | Fujii et al. .................. 327/534 |
| 6,300,819 B1 | * | 10/2001 | De et al. ..................... 327/534 |
| 6,404,270 B1 | * | 6/2002 | Meng ......................... 327/534 |

FOREIGN PATENT DOCUMENTS

JP 6-326528 11/1994

* cited by examiner

*Primary Examiner*—My-Trang Nuton
(74) *Attorney, Agent, or Firm*—Oblon, Spivak, McClelland, Maier & Neustadt, P.C.

(57) ABSTRACT

Voltage comparator circuit capable of precisely comparing voltages to ground and power supply potentials, without level converter or plurality of power supplies. First and second MOS transistors, with gates commonly connected and drains are connected to a first power supply potential with the same gate width and length. Third MOS transistor with opposite conductive type than first and second, with drain connected to second power supply potential connected to source of first. A fourth MOS transistor with opposite conductive type to the first and second, with a drain connected to the second power supply potential, with same gate width and length as the third. The drain and gate of the first are connected, and a comparative reference potential applies to the gate of the third. Input signal is given to gate of the fourth, and output signal is derived from the drain of the second.

11 Claims, 5 Drawing Sheets

VOLTAGE COMPARATOR CIRCUIT AND SUBSTRATE BIAS ADJUSTING CIRCUIT USING SAME

CROSS REFERENCE TO RELATED APPLICATIONS

The subject application is related to subject matter disclosed in Japanese Patent Application No. H12-20810 filed on Jan. 28, 2000 in Japan to which the subject application claims priority under Paris Convention and which is incorporated herein by reference.

BACKGROUND OF THE INVENTION

1. Field of the Invention

The present invention relates generally to a voltage comparator circuit in a CMOS integrated circuit. More specifically, the invention relates to a voltage comparator circuit for comparing voltages close to a ground or power supply potential, the voltage comparator circuit being used for detecting the occurrence of abnormality, such as a case where a p-n junction between the source and substrate of a CMOS integrated circuit is biased in a forward direction, in the control of a substrate potential.

2. Description of the Background Art

Figure 7:
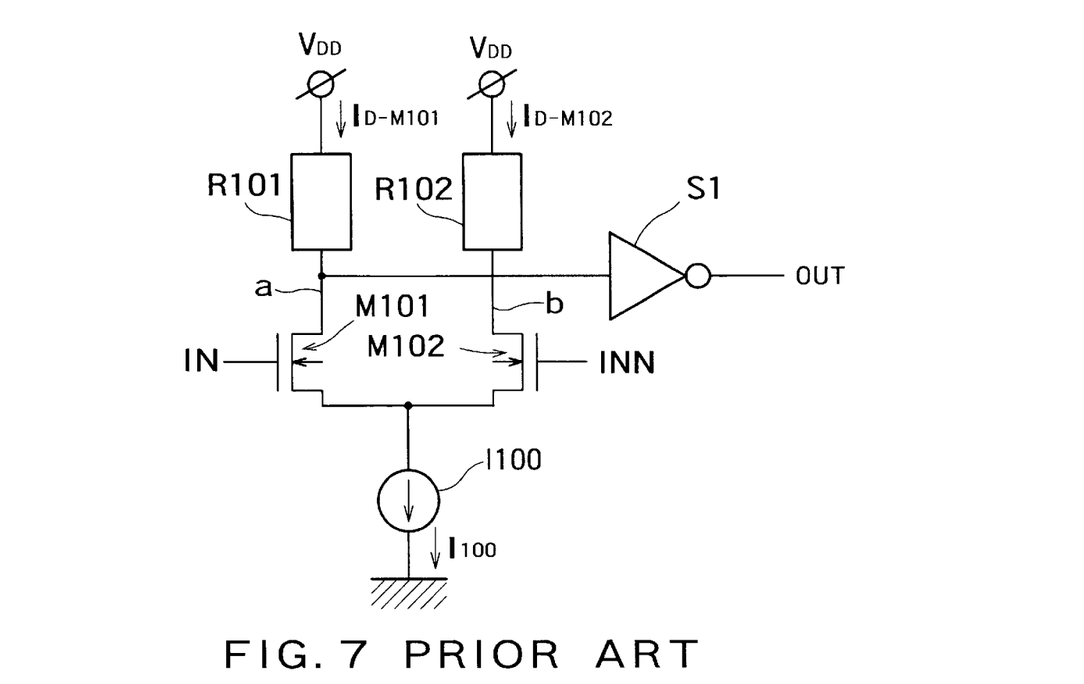
FIG. 7 is a circuit diagram showing an example of a conventional voltage comparator circuit requiring level conversion.

FIG. 7 shows a MOS differential amplifier circuit which is conventionally often used for comparing voltages.

The sources of a pair of N-channel MOS transistors (which will be hereinafter referred to as NMOS transistors) M101 and M102 are commonly connected to be grounded via a current source I100. The gate of the NMOS transistor M101 is connected to an input terminal IN to which a signal $V_{IN}$ is inputted. The gate of the NMOS transistor M102 is connected to an input terminal INN to which a signal $V_{INN}$ having the opposite phase to that of the input terminal IN is inputted. One end of a resistor R101 is connected to the node a of the drain of the NMOS transistor M101, and the other end thereof is connected to a power supply VDD. One end of a resistor R102 is connected to the node b of the drain of the NMOS transistor M102, and the other end thereof is connected to a power supply VDD. The node a is connected to the input terminal of a buffer S1 to derive a signal from an output terminal OUT. In place of the signal $V_{INN}$, a reference voltage Vref for comparing voltages may be applied to the input terminal INN.

The principle of operation of the differential amplifier circuit with this construction is well known as follows. The potential difference between the input terminals IN and INN causes a difference between the gate-to-source voltages $V_{GS\_M101}$ and $V_{GS\_M102}$ of the NMOS transistors M101 and M102, to cause a difference between the proportions of currents of the NMOS transistors M101 and M102, into which a current $I_{100}$ supplied from the current source I100 is divided, i.e., a difference between a drain current $I_{D\_M101}$ of the NMOS transistor M101 and a drain current $I_{D\_M102}$ of the NMOS transistor M102. These relationships are expressed as follows:

$$I_{D\_M101}=k(V_{GS\_M101}-Vth)^2 \qquad \text{(Expression 1)}$$

$$I_{D\_M102}=k(V_{GS\_M102}-Vth)^2 \qquad \text{(Expression 2)}$$

$$I_{D\_M101}+I_{D\_M102}=I_{100} \qquad \text{(Expression 3)}$$

wherein Vth is the threshold voltage of the MOS transistor. The coefficient k is defined by the following expression using a gate width W, a gate length L, a gate capacity $C_{OX}$ and a mobility $\mu_n$ of electrons in Si.

$$K=\tfrac{1}{2}\mu_n C_{OX} W/L \qquad \text{(Expression 4)}$$

The drain currents $I_{D\_M101}$ and $I_{D\_M102}$ derived from the difference between the gate-to-source voltages $V_{GS\_M101}$ and $V_{GS\_M102}$ on the basis of the above described expressions are as follows.

$$I_{D\_M101}=I_{100}/2+k(V_{GS\_M101}-V_{GS\_M102})/2 \\ \sqrt{\{2I_{100}/k-(V_{GS\_M101}-V_{GS\_M102})^2\}} \qquad \text{(Expression 5)}$$

$$I_{D\_M102}=I_{100}/2-k(V_{GS\_M101}-V_{GS\_M102})/2 \\ \sqrt{\{2I_{100}/k-(V_{GS\_M101}-V_{GS\_M102})^2\}} \qquad \text{(Expression 6)}$$

A voltage is derived from the output terminal OUT via the buffer S1 having a voltage Va of the node a which is generated by the current $I_{D\_M101}$ flowing through the resistor R101. The voltage Va of the node a is expressed as follows.

$$Va=VDD-I_{D\_M101}R_{101} \qquad \text{(Expression 7)}$$

This conventional circuit has a comparable voltage range of from about 0 V to a power supply voltage. If the reference potential Vref for comparing voltages is set to be 0 V or the power supply voltage to be used for comparing voltages approximating to the ground or power supply potential, there is a problem. If the reference potential Vref is set to be 0 V and if the voltage of the input terminal IN is set to be about 0 V, the source potentials of the NMOS transistors M101 and M102 become to negative potentials since the sources of the NMOS transistors M101 and M102 are connected to the ground potential via the current source. However, it is generally difficult to generate such negative potentials, if the reference potential Vref=0 V is applied to the input terminal INN, the gate-to-source voltage $V_{GS\_M102}$ of the NMOS transistor M102 is below the threshold voltage, so that the NMOS transistor M102 is always turned off so as not to be operated. If the reference potential Vref is set to be the power supply potential and if the voltage of the input terminal IN is set to approximate to the power supply voltage, the source potentials of the NMOS transistors M101 and M102 increase. Therefore, there is a limit to the amplitude of the voltage Va of the node a which is the drain of the NMOS transistor M101, so that the buffer is difficult to receive signals.

Figure 8:
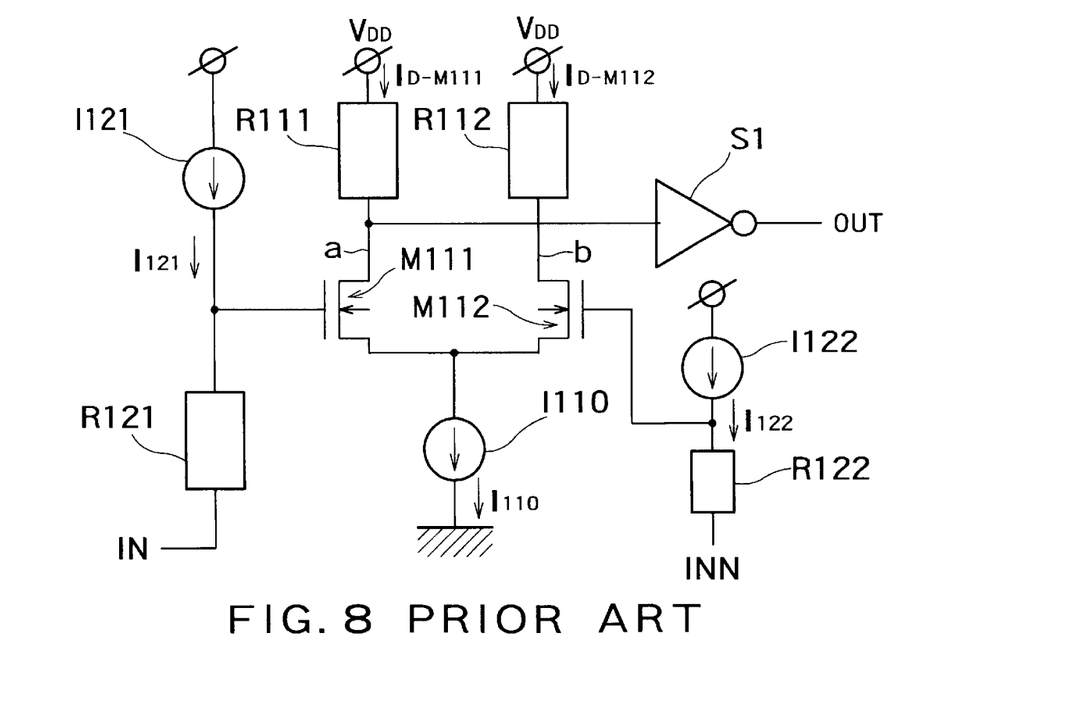
FIG. 8 is a circuit diagram showing an example of a conventional voltage comparator circuit with a level shift circuits.

Accordingly, if lower voltages than the ground potential are compared with each other, a differential amplifier circuit shown in FIG. 8 has been conventionally used. A level shifter circuit is added for converting voltages which are applied to the gates of NMOS transistors M111 and M112. One end of a resistor R121 is connected to an input terminal IN, and the other end thereof is connected to a constant current source I121 and the gate of the NMOS transistor M111. One end of a resistor R122 is connected to an input terminal INN, and the other end thereof is connected to a constant current source I122 and the gate of the NMOS transistor M112. By always passing currents $I_{121}$ and $I_{122}$ through the resistors R121 and R122, the voltages of the other ends of the resistors R121 and R122 are shifted by a predetermined voltage with respect to the input terminals IN and INN. Thus, even if lower voltages than the ground potential are compared with each other, the gate potentials of the NMOS transistors M111 and M112 can be in the range of from about 0 V to the power supply voltage, which is a voltage range capable of being compared by conventional circuits. However, in this method, there are problems in that current consumption increases since the currents $I_{121}$ and $I_{122}$ must be passed through the level shifter circuit and that the currents $I_{121}$ and $I_{122}$ are passed through the input terminals. In the case of a voltage comparator circuit for use in the detection of a substrate potential, it is desired to prevent such currents from passing through the input terminals into the substrate. Because the burden imposed on a substrate bias generating circuit is increased by the currents, which thus flow into the substrate, to increase current consumption.

There is also considered a method for changing the ground potential, to which the current source I100 of the differential amplifier circuit shown in FIG. 7 is connected, into a negative potential to increase the range of comparable input voltages. However, in this method, there is a problem in that it is required to additionally provide a power supply voltage.

Figure 9:
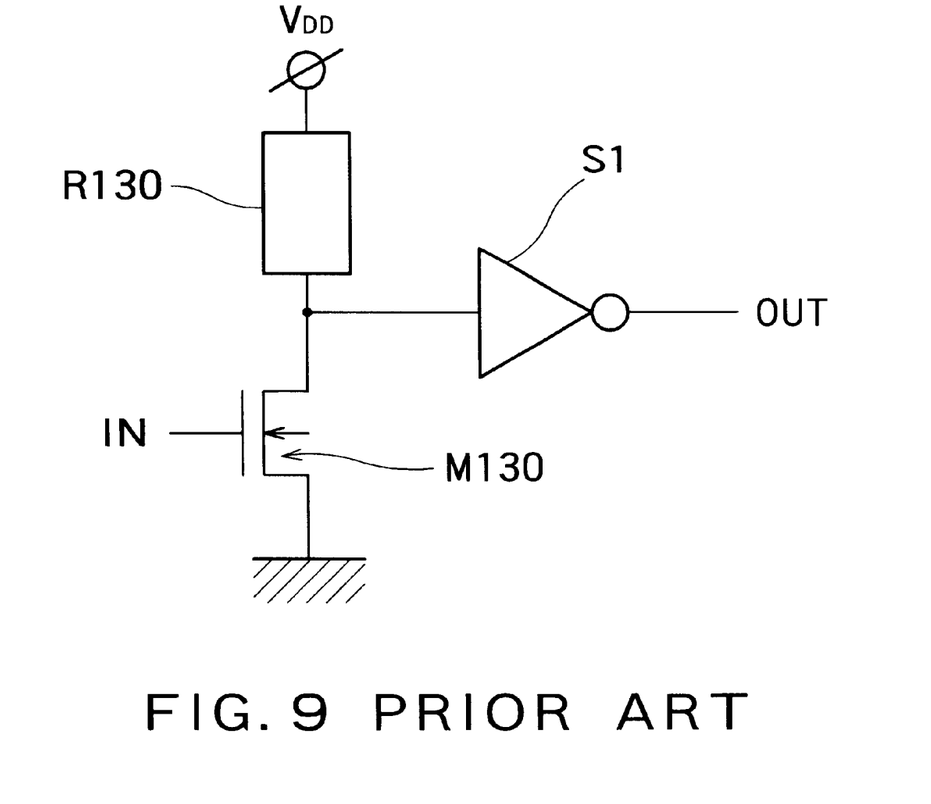
FIG. 9 is a circuit diagram showing an example of a conventional voltage comparator circuit using threshold voltage.

A simple circuit shown in FIG. 9 is also known. The source of an NMOS transistor M130 is connected to the ground potential, the drain thereof is connected to one end of a resistor R130 and the input terminal of a buffer S1, and the gate thereof is connected to an input terminal IN. The other end of the resistor R130 is connected to a power supply potential VDD, and the output terminal of the buffer S1 is connected to an output terminal OUT. With this construction, if the voltage $V_{IN}$ of the input terminal IN is higher than the threshold voltage of the NMOS transistor M130, the NMOS transistor M130 is turned on to pass its drain current through the resistor R130 to decrease the voltage of the input terminal of the buffer S1, so that the signal level of the output terminal OUT changes from a low level to a high level.

Thus, in this case, the voltage serving as a reference for comparison is the threshold voltage of the NMOS transistor M130, so that there are problems in that the detectable voltage must be slightly higher than the ground potential and that the circuit is easily influenced by the variation in device and temperature.

SUMMARY OF THE INVENTION

It is therefore an object of the present invention to eliminate the aforementioned problems and to provide a voltage comparator circuit capable of simply and precisely comparing a voltage with a ground or power supply potential.

In order to accomplish the aforementioned and other objects, according to one aspect of the present invention, there is provided a voltage comparator circuit comprising: a pair of first and second MOS transistors of a conductive type, the gates of which are commonly connected, and each of the drains of which is connected to a first power supply potential via a current source for passing the same current, the first and second MOS transistors having the same gate width and gate length; a third MOS transistor of the opposite conductive type to that of the first and second MOS transistors, the drain of the third MOS transistor being connected to a second power supply potential, and the source of the third MOS transistor being connected to the source of the first MOS transistor; and a fourth MOS transistor of the opposite conductive type to that of the first and second MOS transistors, the drain of the fourth MOS transistor being connected to the second power supply potential, and the source of the fourth MOS transistor being connected to the source of the second MOS transistor, the fourth MOS transistor having the same gate width and gate length as those of the third MOS transistor, wherein the drain and gate of the first MOS transistor are connected to each other, and a comparative reference potential is applied to the gate of the third MOS transistor, and wherein an input signal is given to the gate of the fourth MOS transistor, and an output signal is derived from the drain of the second MOS transistor.

With this construction, it is possible to precisely compare voltages without the need of any level converting means and a plurality of power sources.

If the voltage comparator circuit further comprises a differential amplifier for comparing a voltage at the drain of the first MOS transistor with a voltage at the drain of the second MOS transistor, it is possible to cancel the difference between the characteristics of elements due to the variation in producing process and temperature change, in addition to the above described effect.

According to another aspect of the present invention, there is provided a substrate bias adjusting circuit comprising: circuit means for detecting that a P-well potential is higher than a ground potential, to produce a signal; and circuit means for short-circuiting the P-well potential to the ground potential on the basis of the signal to rapidly return the P-well potential to the ground potential.

According to a further aspect of the present invention, there is provided a substrate bias adjusting circuit comprising: circuit means for detecting that an N-well potential is lower than a power supply potential, to produce a signal; and circuit means for short-circuiting the N-well potential to the power supply potential on the basis of the signal to rapidly return the N-well potential to the power supply potential.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, some preferred embodiments of the present invention will be described below.

Figure 1:
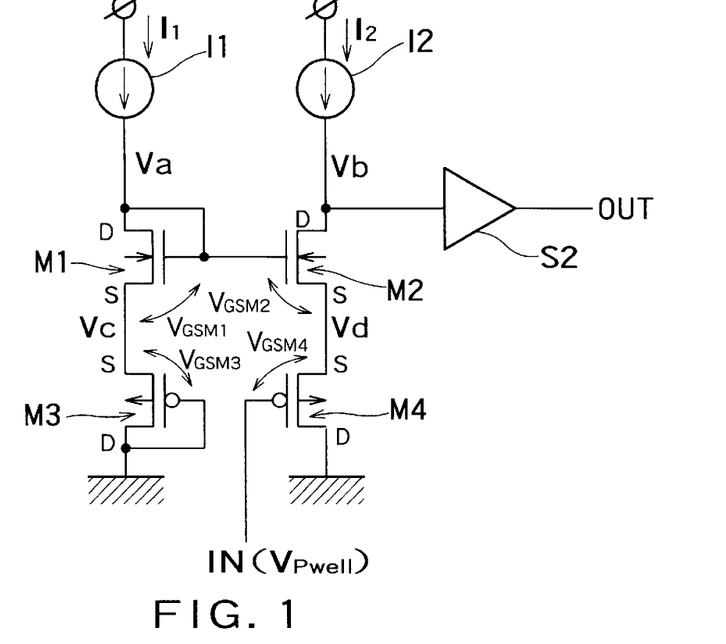
FIG. 1 is a circuit diagram showing the construction of the first preferred embodiment of a voltage comparator circuit according to the present invention.

FIG. 1 is a circuit diagram showing the first preferred embodiment of the present invention. This circuit is a circuit for detecting the occurrence of a state that the potential Vpwell of a P-well rises to a ground potential or higher when a substrate bias is applied.

The sources of a pair of NMOS transistors M1 and M2, the gates of which are commonly connected, are connected to the sources of a pair of PMOS transistors M3 and M4, respectively. The drains of the pair of PMOS transistors M3 and M4 are grounded. The drains of the pair of NMOS transistors M1 and M2 are connected to power supplies via current sources I1 and I2, respectively. The gate and source of each of the transistors M1 and M3 are connected to each other.

The gate of the transistor M4 serves as an input terminal, and an output is derived from the drain of the transistor M2 via a buffer S2.

The pair of NMOS transistors M1 and M2 have the same gate length and gate width, and the pair of PMOS transistors M3 and M4 have the same gate length and gate width.

In this case, if the current sources I1 and I2 are set to have the same current I, when the voltage Vpwell of an input signal IN is the same potential as ground, i.e., 0 V, the nodes a and b are equal to each other, and the nodes c and d are equal to each other.

At this time, the potential Vc of the node c is the gate-to-source voltage $V_{GS\_M3}$ of the MOS transistor M3, and expressed by the following expression.

$$Vc = V_{GS\_M3} = Vthp + \sqrt{\frac{I_1}{k}} \quad \text{(Expression 8)}$$

On the other hand, the potential Va of the node c is the gate-to-source voltage $V_{GS\_M1}$ of the MOS transistor M1, and expressed by the following expression.

$$Va = V_{GS\_M1} = VthN + Vthp + 2\sqrt{\frac{I_1}{k}} \quad \text{(Expression 9)}$$

There will be considered the voltage Vd of the node d and the voltage Vb of the node b on condition that the current $I_1$ is equal to the current $I_2$. Supposing a state that the input signal IN has 0 V, the potential Vd of the node d is as follows.

$$Vd = V_{GS\_M4} = Vthp + \sqrt{\frac{I_2}{k}} \quad \text{(Expression 10)}$$

Comparing Expression 8 with Expression 10, the right sides are equal to each other assuming that $I_1=I_2$, then Vc=Vd.

The potential Vb of the node b is expressed by the following expression.

$$Vb = V_{GS\_M2} + Vd = Vthn + Vthp + 2\sqrt{\frac{I_2}{k}} \quad \text{(Expression 11)}$$

Comparing Expression 9 with Expression 11, the right sides are equal to each other assuming that $I_1=I_2$, then Va=Vb.

Then, there will be considered a state that the potential Vpwell of the input signal is slightly higher than 0 V.

In this case, the potential of the node d is intended to be expressed by the following expression.

$$Vd = V_{GS\_M4} = Vthp + \sqrt{\frac{I_2}{k}} + Vpwell \quad \text{(Expression 12)}$$

However, since the gate potential of the NMOS transistor M2 is determined by the potential Va of the node a, the gate-to-source voltage $V_{GS\_M2}$ of the NMOS transistor M2 relatively decreases if the potential of the node d increases. Therefore, assuming that the current flowing through the NMOS transistor M2 and PMOS transistor M4 is Ix, this current decreases.

In this case, the following expressions are established.

$$V_{GS\_M2} = Va - Vd = Vthn + \sqrt{\frac{I_X}{k}} \quad \text{(Expression 13)}$$

$$V_{GS\_M4} = Vd - Vpwell = Vthp + \sqrt{\frac{I_X}{k}} \quad \text{(Expression 14)}$$

Since the relationship between the current $I_2$ supplied from the current source I2 and the current Ix consumed by the MOS transistors M2 and M4 is $I_2$>Ix when Vpwell>0 V, the potential Vb of the node b rises to the power supply voltage. This voltage of the node b is received by the buffer S2. When the voltage b exceeds the circuit threshold voltage of the buffer S2, the level of the output signal OUT changes from a low level to a high level.

Then, there will be considered a state that the potential Vpwell of the input signal is slightly lower than 0 V.

From expression 8, the potential Vd of the node d is expressed by the following expression.

$$Vd = V_{GS\_M4} + Vpwell = Vpwell + Vthp + \sqrt{\frac{I_X}{k}} \quad \text{(Expression 15)}$$

When the potential Vpwell decreases, the potential Vd of the node d also decreases. However, the potential Vd is never lower than the source potential of 0 V.

Since the gate potential of the NMOS transistor M2 is determined by the potential Va of the node a, the gate-to-source voltage $V_{GS\_M2}$ of the NMOS transistor M2 relatively increases if the potential of the node d decreases. Therefore, the current Ix flowing through the N-channel MOS transistor M2 and PMOS transistor M4 increases.

As a result, when the relationship between the current $I_2$ supplied from the current source I2 and the current Ix consumed by the MOS transistors M2 and M3 is Vpwell<0 V, then $I_2$<Ix, so that the potential Vb of the node b decreases to the potential Vd of the node d.

When the voltage Vb of the node b decreases to be lower than the circuit threshold voltage of the buffer S2, the level of the output signal OUT changes from the high level to the low level.

The substrate potential can be thus compared with 0 V.

In this preferred embodiment, it is not required to pass excessive current and to provide a plurality of current sources, and the pair of transistors are formed at the same time, so that the influence of the variation in process is small.

While this circuit has detected the potential of the P-well, the circuit can detect the potential of an N-well by simply replacing elements.

Figure 2:
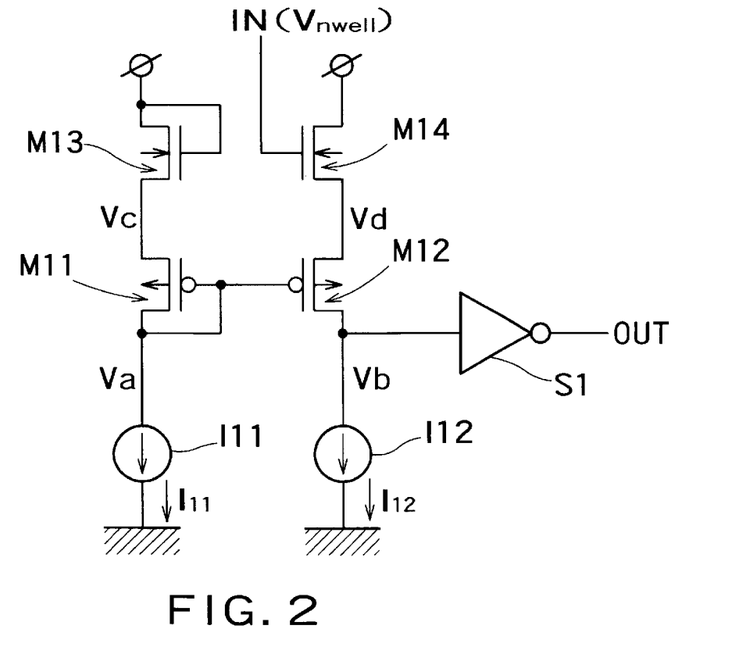
FIG. 2 is a circuit diagram showing the construction of a circuit wherein the conductive types and voltage relationships of transistors are reverse to those in FIG. 1.

FIG. 2 is a circuit diagram showing the construction of such a circuit for detecting the potential of an N-well.

The sources of a pair of PMOS transistors M11 and M12, the gates of which are commonly connected to each other, are connected to the sources of a pair of NMOS transistors M13 and M14, respectively. The drains of the NMOS transistors M13 and M14 are connected to power supplies. The drains of the pair of the PMOS transistors M11 and M12 are grounded via current sources I11 and I12, respectively. The gate and drain of each of the transistors M11 and M13 are connected to each other.

The gate of the NMOS transistor M14 serves as an input terminal to which an N-well potential (VNwell) serving as an input signal is supplied, and an output is derived from the drain of the PMOS transistor M12 via a buffer S1. The pair of PMOS transistors M11 and M12 have the same gate length and gate width, and the pair of NMOS transistors M13 and M14 have the same gate length and gate width.

The conductive type of each of transistors in this circuit is reverse to that in FIG. 1, and the operation of this circuit is the same as that in FIG. 1 to compare the N-well potential serving as an input potential with the power supply potential to detect that the N-well potential is lower than the power supply potential.

Figure 3:
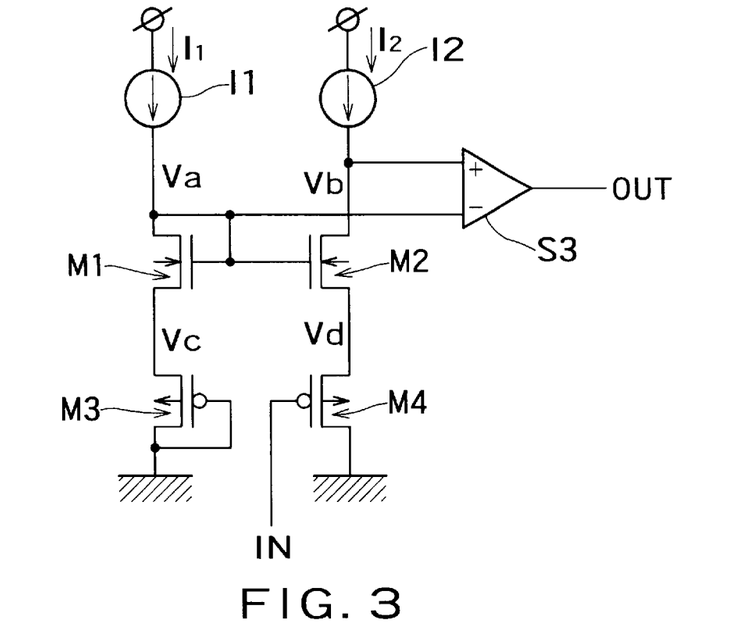
FIG. 3 is a circuit diagram showing the construction of the second preferred embodiment of a voltage comparator circuit according to the present invention.

FIG. 3 is a circuit diagram showing the construction of the second preferred embodiment of a comparator circuit according to the present invention.

In this preferred embodiment, the precision in the preferred embodiment shown in FIG. 1 is further improved. That is, in the construction shown in FIG. 1, the comparison operation is difficult to be influenced by the variation in process, but there are some cases where the potential itself of the node b varies under the influence of the variation in producing process and temperature change. In such cases, if determination is carried out using the circuit threshold voltage of the buffer S2 for receiving the signal of the node b, the voltage for determining that the P-well potential Vpwell is equal to 0 V is shifted, so that precision is not always sufficient.

In the circuit shown in FIG. 3, the voltages at the nodes a and b are compared with each other by a differential amplifier S3, so that the influence of the variation in producing process and temperature change is canceled.

Thus, as described by expressions 8 through 11, the differential amplifier can detect that Vb=Va when Vpwell=0 V, so that precision can be improved in comparison with the first preferred embodiment.

Figure 4:
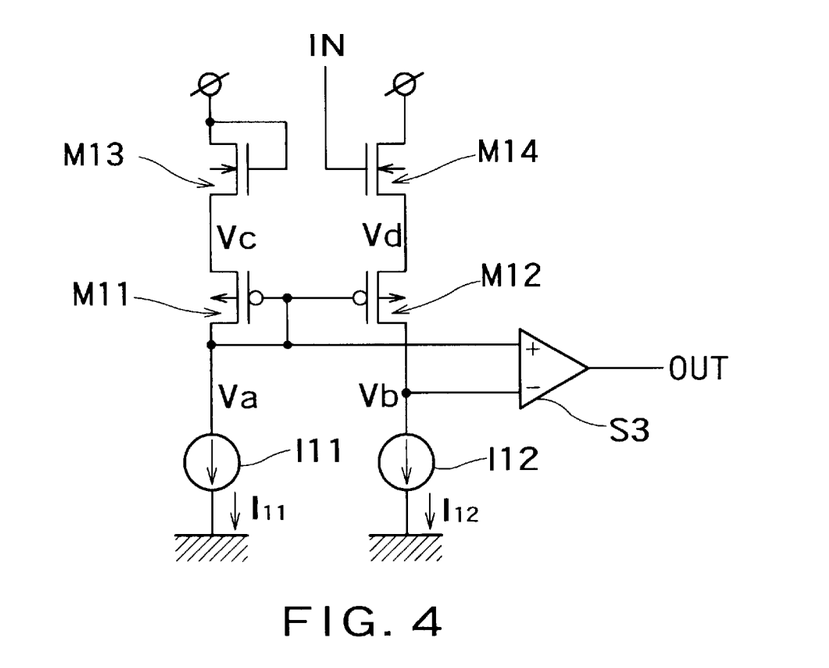
FIG. 4 is a circuit diagram showing the construction of a circuit wherein the conductive types and voltage relationships of transistors are reverse to those in FIG. 3.

FIG. 4 is a circuit diagram showing an example of a circuit wherein the construction shown in FIG. 3 is modified for detecting an N-well. This is the same comparator circuit as that in FIG. 2, except that the voltages at nodes a and b are compared with each other by a differential amplifier S3. This circuit can improve precision similar to that in FIG. 3.

In the constructions in FIGS. 1 through 4, it is supposed that the comparative reference voltage is the ground potential or the power supply potential. However, the comparative reference voltage should not be limited thereto, but an optional voltage may be used as the comparative reference voltage.

If the current sources I1 and I2 are replaced with a pair of resistors having the same resistance value, the same effects can be obtained.

Figure 5:
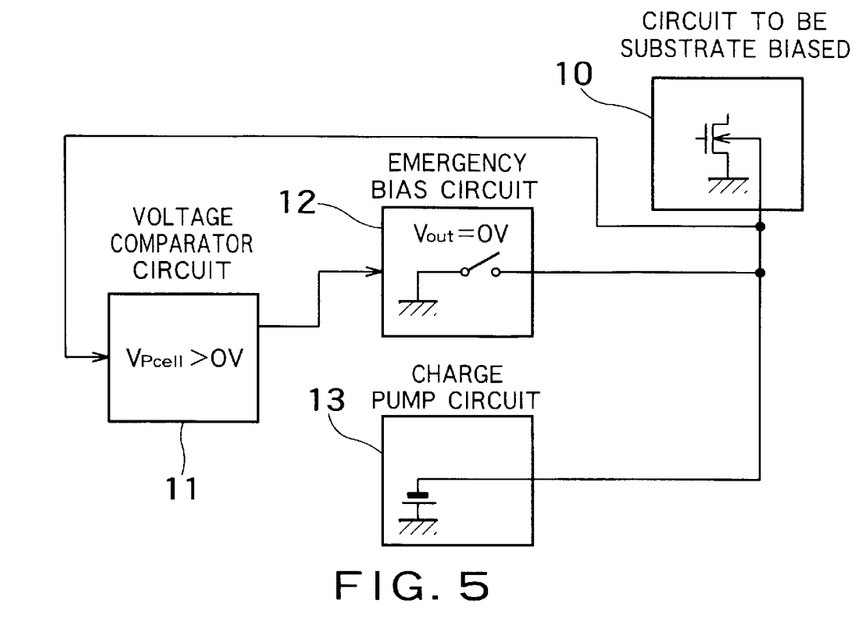
FIG. 5 is a block diagram showing the construction of a bias adjusting circuit according to the present invention, which uses a voltage comparator circuit according to the present invention.

FIG. 5 is a block diagram schematically showing the construction of the third preferred embodiment of a substrate bias adjusting circuit according to the present invention.

As shown in FIG. 5, a circuit 10 to be substrate-biased is generally biased by a charging pump circuit 13. By the voltage comparator circuit 11 shown in FIGS. 1 and 3, a P-well potential is compared with the ground potential (0 V), which is the source potential of the N-channel MOS transistor, to determine whether the P-well potential is higher than the ground potential. If it is determined that the P-well potential is higher than the ground potential, an emergency bias circuit 12 is operated to compulsorily decrease the bias voltage for the substrate to the ground potential.

Figure 6:
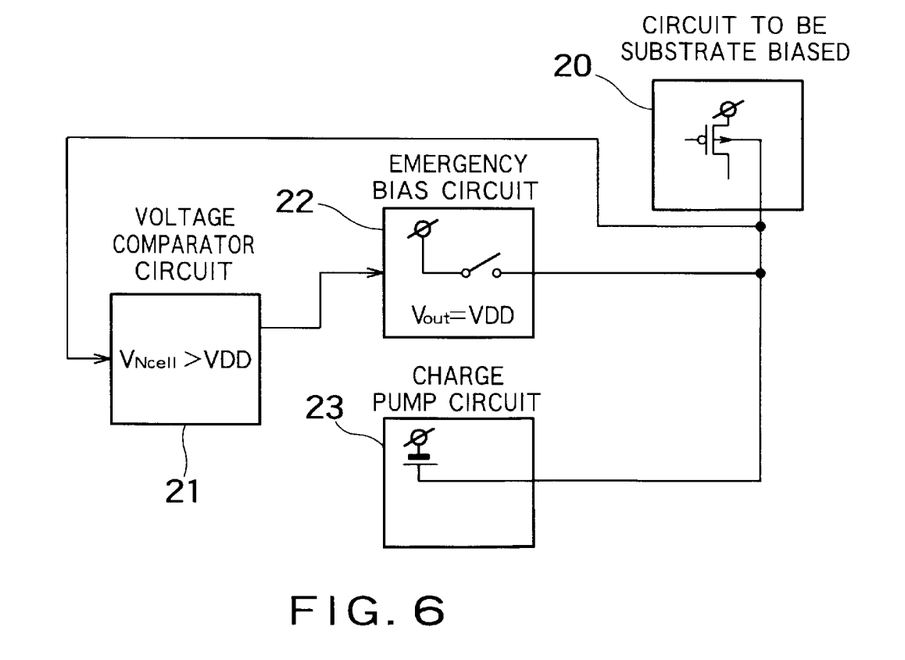
FIG. 6 is a block diagram showing the construction of the same circuit as that in FIG. 5, except that a substrate bias is applied using a power supply potential as a reference.

FIG. 6 is a block diagram schematically showing the construction of a substrate bias adjusting circuit which is similar to that in FIG. 5. In this figure, the substrate bias applied to a circuit 20, which is an object to be substrate-biased, by a charging pump circuit 23 has a voltage of a power supply potential VDD or higher. The voltage comparator circuit 21 shown in FIGS. 2 and 4 is designed to compare an N-well potential with the power supply potential (VDD), which is the source potential of the P-channel MOS transistor, to determine whether the N-well potential is lower than the power supply potential. If it is determined that the N-well potential is lower than the power supply potential, an emergency bias circuit 22 is operated to compulsorily raise the bias voltage for the substrate to the power supply potential.

The emergency bias circuit in FIGS. 5 and 6 can use all of well-known potential falling means and potential raising means.

As described above, according to the voltage comparator circuit of the present invention, it is possible to precisely compare voltages, particularly voltages close to ground and power supply potentials, without the need of any level converting means and a plurality of power supplies.

In the preferred embodiment wherein the voltage at a corresponding node of a transistor, which is companion to an output node, is compared by a differential amplifier, the influence of the variation in production of devices and the influence of temperature change can be canceled in addition to the above described effects, so that it is possible to more precisely compare voltages.

In the bias adjusting circuit according to the present invention, when it is determined on the basis of the output of the above described voltage comparator circuit that the substrate bias is different from a normal value, the substrate bias is compulsorily changed so as to be coincident with the normal value. Therefore, it is possible to always maintain the normal substrate bias value, so that it is possible to stabilize the operation of the circuit.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A voltage comparator circuit comprising:

a pair of first and second MOS transistors of a conductive type, the gates of which are commonly connected, and each of the drains of which is connected to a first power supply potential via a current source for passing the same current, said first and second MOS transistors having the same gate width and gate length;

a third MOS transistor of the opposite conductive type to that of said first and second MOS transistors, the drain of said third MOS transistor being connected to a second power supply potential, and the source of said third MOS transistor being connected to the source of said first MOS transistor; and a fourth MOS transistor of the opposite conductive type to that of said first and second MOS transistors, the drain of said fourth MOS transistor being connected to said second power supply potential, and the source of said fourth MOS transistor being connected to the source of said second MOS transistor, said fourth MOS transistor having the same gate width and gate length as those of said third MOS transistor, wherein the drain and gate of said first MOS transistor are connected to each other, and a comparative reference potential is applied to the gate of said third MOS transistor, and wherein an input signal is given to the gate of said fourth MOS transistor, and an output signal is derived from the drain of said second MOS transistor.

2. A voltage comparator circuit as set forth in claim 1, wherein said conductive type is N-channel type, and said opposite conductive type is P-channel type, and wherein said first power supply potential is a high power supply potential, and said second power supply potential is the ground potential.

3. A voltage comparator circuit as set forth in claim 2, wherein said comparative reference potential is the ground potential, and said input signal has a P-well potential.

4. A voltage comparator circuit as set forth in claim 2, which further comprises a buffer connected to the drain of said second MOS transistor.

5. A voltage comparator circuit as set forth in claim 2, which further comprises a differential amplifier for comparing a voltage at the drain of said first MOS transistor with a voltage at the drain of said second MOS transistor.

6. A voltage comparator circuit as set forth in claim 1, wherein said conductive type is P-channel type, and said opposite conductive type is N-channel type, and wherein said first power supply potential is the ground potential, and said second power supply potential is a high power supply potential.

7. A voltage comparator circuit as set forth in claim 6, wherein said comparative reference potential is a high power supply potential, and said input signal is an N-well potential.

8. A voltage comparator circuit as set forth in claim 6, which further comprises a buffer connected to the drain of said second MOS transistor.

9. A voltage comparator circuit as set forth in claim 6, which further comprises a differential amplifier for comparing a voltage at the drain of said first MOS transistor with a voltage at the drain of said second MOS transistor.

10. A voltage comparator circuit as set forth in claim 1, which further comprises a buffer connected to the drain of said second MOS transistor.

11. A voltage comparator circuit as set forth in claim 1, which further comprises a differential amplifier for comparing a voltage at the drain of said first MOS transistor with a voltage at the drain of said second MOS transistor.

* * * * *